US006856260B2

(12) United States Patent
Hulett et al.

(10) Patent No.: US 6,856,260 B2
(45) Date of Patent: Feb. 15, 2005

(54) SIGNAL CONTROLLER

(75) Inventors: Malcolm John Hulett, New Tredegar (GB); Lee Brain, Blackwood (GB)

(73) Assignee: Penny & Giles Controls Limited, Gwent (GB)

( * ) Notice: Subject to any disclaimer, the term of this patent is extended or adjusted under 35 U.S.C. 154(b) by 0 days.

(21) Appl. No.: 10/469,805

(22) PCT Filed: Mar. 4, 2002

(86) PCT No.: PCT/GB02/00929
§ 371 (c)(1),
(2), (4) Date: Mar. 3, 2004

(87) PCT Pub. No.: WO02/071602
PCT Pub. Date: Sep. 12, 2002

(65) Prior Publication Data
US 2004/0130465 A1 Jul. 8, 2004

(30) Foreign Application Priority Data
Mar. 2, 2001 (GB) .............................................. 0105196

(51) Int. Cl.[7] .............................................. H03M 1/22
(52) U.S. Cl. ........................................................ 341/16
(58) Field of Search ................................ 341/1, 5, 9, 13, 341/16

(56) References Cited
U.S. PATENT DOCUMENTS
4,015,253 A * 3/1977 Goldstein ...................... 341/9
4,897,926 A * 2/1990 Altnether et al. ........ 33/203.14
5,719,570 A * 2/1998 Breitbarth ..................... 341/13
5,986,584 A * 11/1999 Breitbarth ..................... 341/13

FOREIGN PATENT DOCUMENTS
GB         18607/73        5/1976
WO         WO 97/13121     4/1997

* cited by examiner

Primary Examiner—Jean Bruner Jeanglaude
(74) Attorney, Agent, or Firm—Testa, Hurwitz & Thibeault, LLP

(57) ABSTRACT

A compact low profile fader has an elongate support and a manually settable slider mounted for linearly slidable relative to the elongate support. A drive transmission operably interconnecting the slider and a digital encoder so that movement of the slider produces a digital output signal from the digital encoder. The digital encoder has a rotatable encoder disk and is mounted so that its longitudinal direction of extent is in alignment with that of the elongate support. The drive transmission includes a drive pulley and a loop of cord which is wound around the pulley. The pulley drives the rotatable encoder and has a helical groove in its peripheral surface. The cord is engaged in the helical groove and with the slider so that movement of the latter causes the pulley, and thereby the rotatable encoder disk, to be rotated.

29 Claims, 4 Drawing Sheets

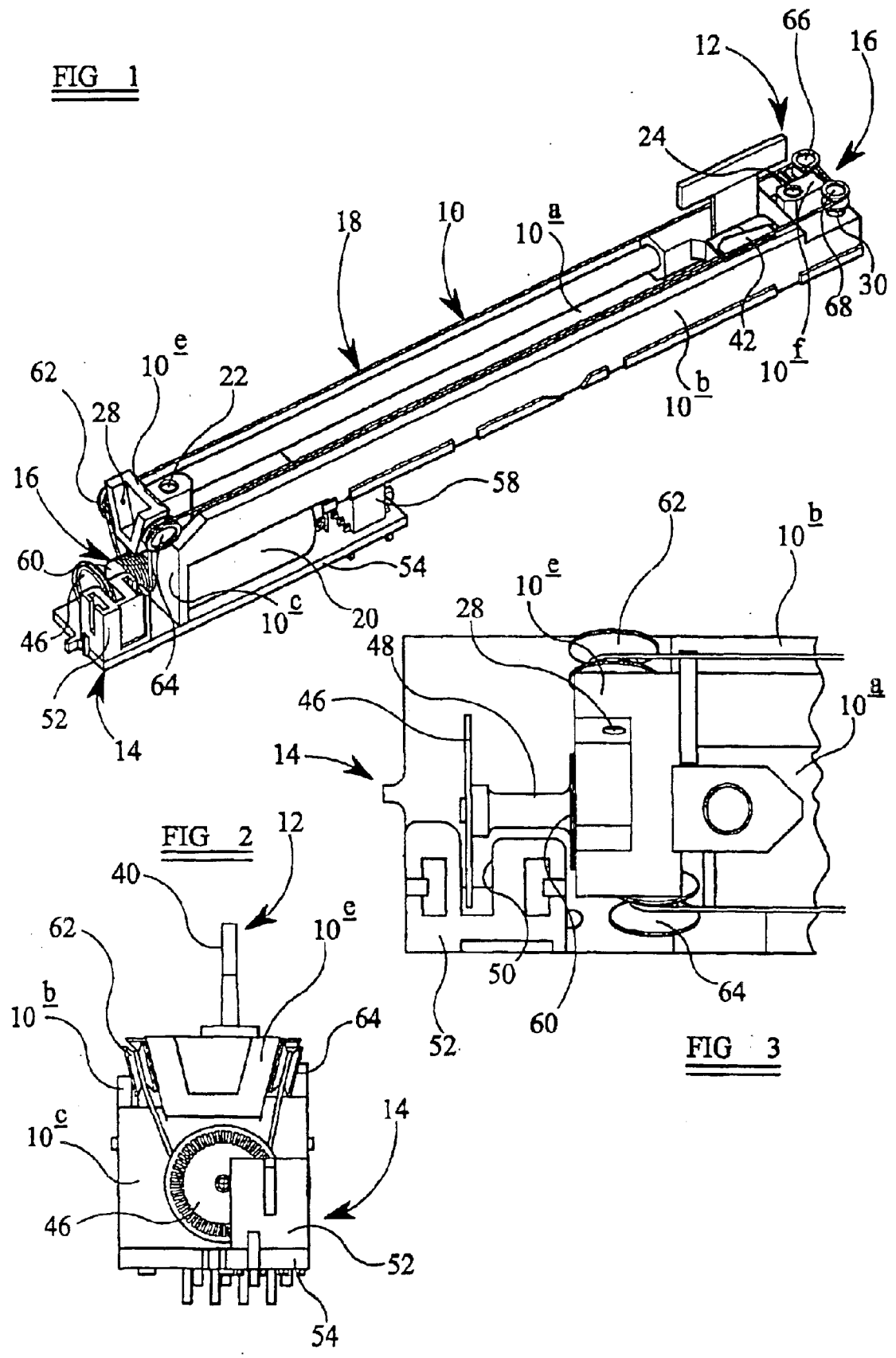

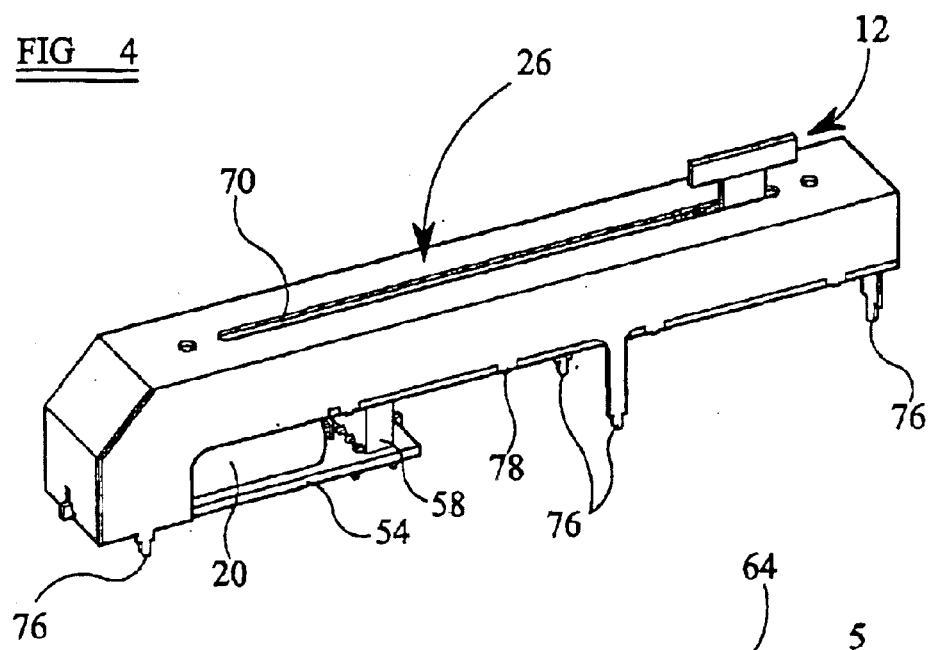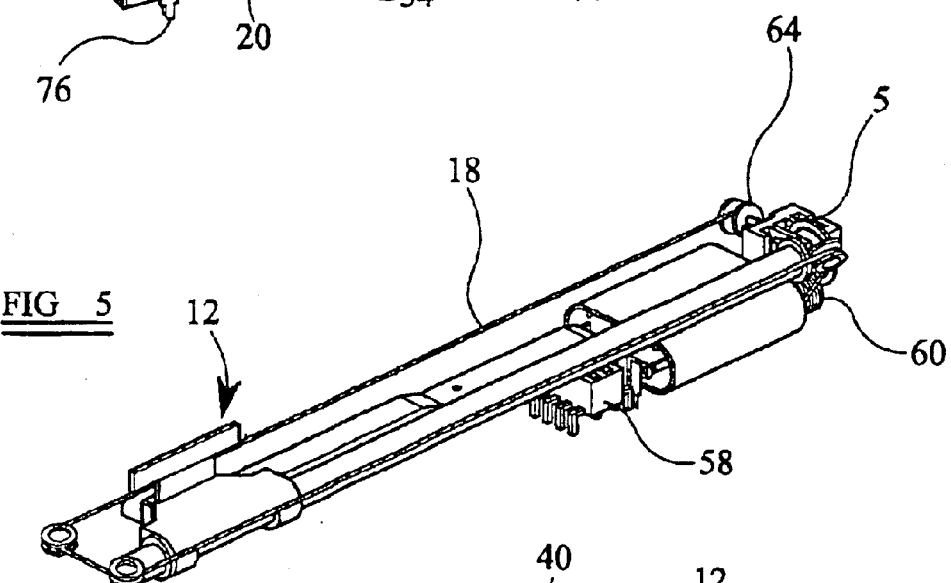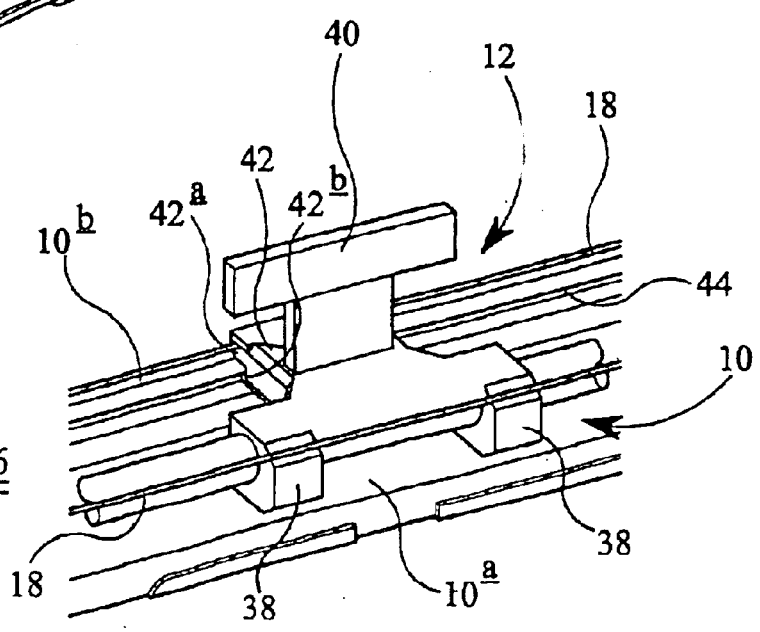

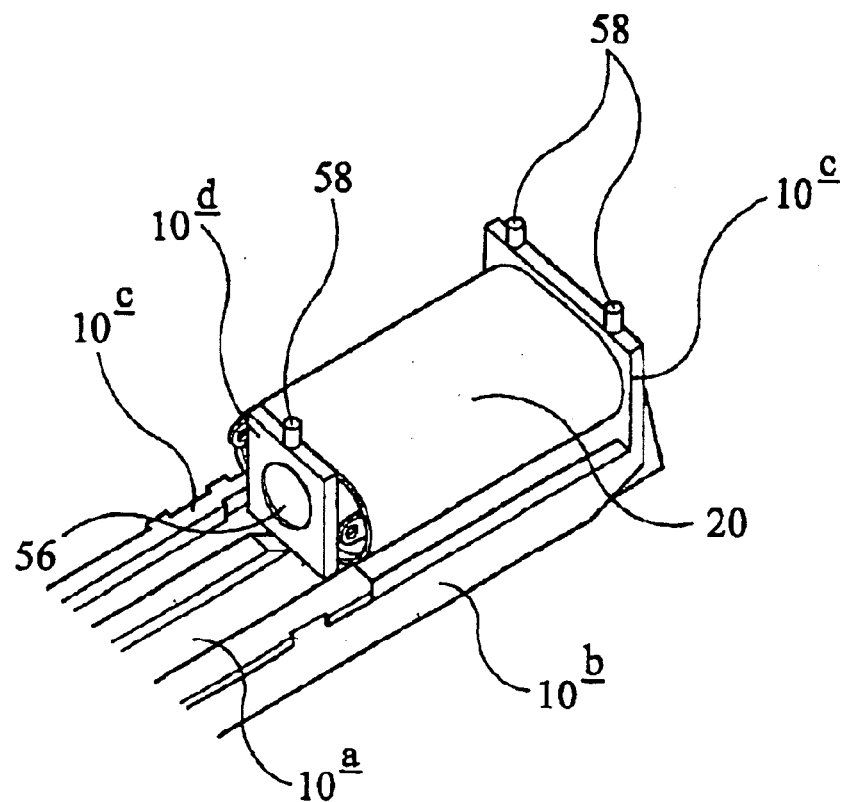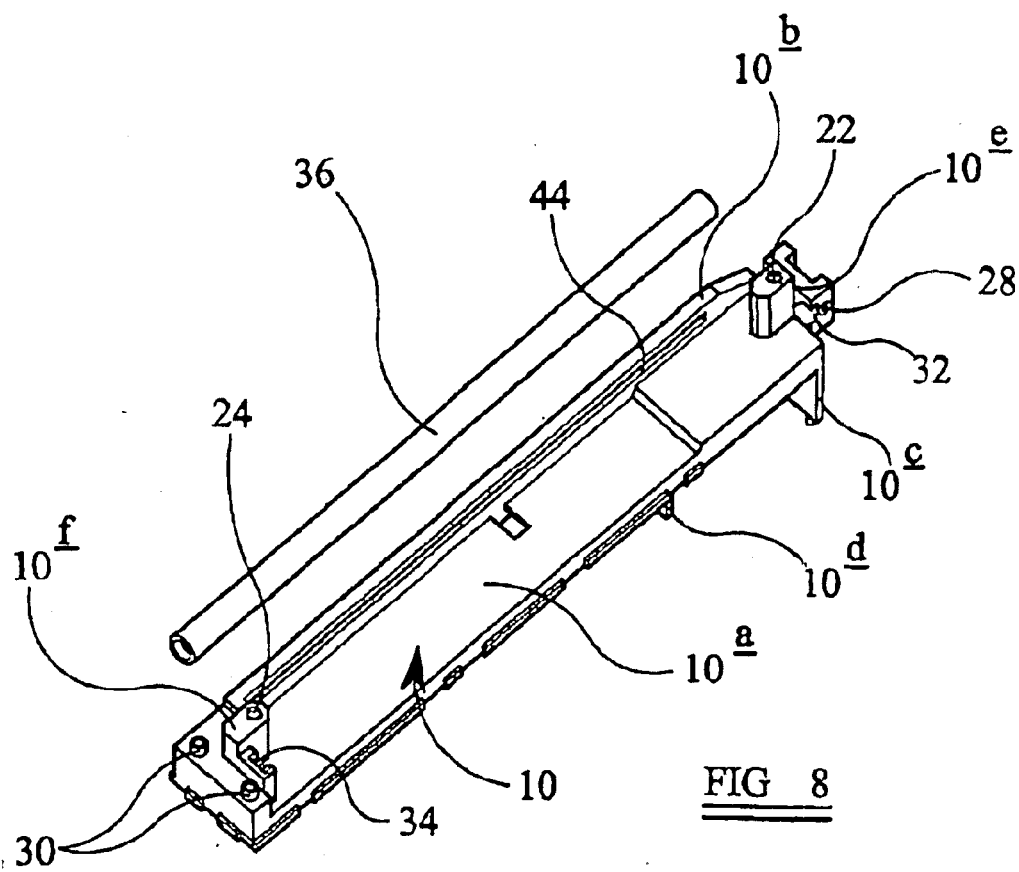

SIGNAL CONTROLLER

CROSS-REFERENCE TO RELATED APPLICATION

This application is the national phase of International (PCT) Patent Application Serial No. PCT/GB02/00929, filed Mar. 4, 2002, published under PCT Article 21(2) in English, which claims priority to and the benefit of British Patent Application No. 0105196.0, filed Mar. 2, 2001, the disclosure of each of which is incorporated herein by reference.

BACKGROUND OF THE INVENTION

This invention relates to a signal controller for providing an output signal which is dependent upon the position of a manually settable element, more particularly the present invention is concerned with a linear motion fader having a compact low profile for mounting in a control desk.

Most current linear motion faders for recording studio mixing desks are analogue potential dividers with a 'tap off' voltage determined by the position of a manually settable slider and controlling the volume level or amplitude associated with a given channel.

A disadvantage associated with such analogue faders is that, as sound processing moves away from analogue and towards digital processing, the analogue output from existing faders must be converted to a digital signal, thus introducing a further processing step.

WO 97/13121 (and corresponding U.S. Pat. No. 5,719,570 and U.S. Pat. No. 5,986,584) discloses an optical encoder-based fader in which an elongate frame member carries a manually operable linear slider which is slidable longitudinally of the frame member. A taut string or wire is wrapped around pulleys at opposite ends of the frame member and is also connected to the slider so that linear movement of the sliders causes the pulleys to rotate. The pulleys are mounted with their axes of rotation perpendicular to the direction of sliding movement of the slider. One of the pulleys is mounted on the shaft of a rotary optical encoder, whilst the other pulley is mounted on the shaft of a motor which can be used to move the string when it is desired to "replay" a previous editing or mixing sequence. Such an arrangement is not particularly compact in the depthwise direction, particularly at both ends of the fader. Also, simply wrapping the string around the pulleys does not ensure that there a good control over the output of the encoder or a smooth feel to the slider.

As control desk manufacturers make their units smaller and lower, it becomes increasingly difficult to use motorised faders within the required space envelope.

SUMMARY OF THE INVENTION

It is an object of the present invention to provide a potentially compact form of signal controller which mitigates the above disadvantage.

According to the present invention, there is provided a signal controller including an elongate support, a manually settable slider mounted for linear reciprocatory sliding movement between limit positions relative to the elongate support, a digital encoder having a rotary encoder member, and a drive transmission including a loop of filamentary material operably interconnecting the slider and the rotary encoder member such that, in use, movement of the slider produces a digital output signal from the digital encoder, wherein the digital encoder has a longitudinal direction of extent which is in substantial alignment with that of the elongate support.

Conveniently, the rotary encoder member has an axis of rotation which extends in the longitudinal direction of extent of the digital encoder.

The drive transmission preferably includes a pair of first pulleys at or adjacent a first end of the elongate support and a pair of second pulleys at or adjacent a second, opposite, end of the elongate support, the pulleys of each pair being mutually spaced apart laterally relative to the longitudinal direction of extent of the elongate support, wherein the filamentary material passes around the first and second pulleys.

Preferably, the drive transmission includes a rotary transmission element which is operably connected to the rotary encoder member and around which the loop of filamentary material passes.

The rotary transmission element preferably has an axis of rotation which extends in the longitudinal direction of extent of the elongate support.

Preferably, the rotary transmission member has a slot therein in which the filamentary material is received. The slot can serve to prevent slip of the filamentary material relative to the rotary transmission member in use. The slot is preferably disposed in an end surface of the rotary transmission member so as to extend transversely with respect to the axis of rotation of the latter. Conveniently, the slot extends chordally so as to open at each end onto the peripheral surface of the rotary transmission member.

Preferably, the loop of filamentary material has a knot therein which joins opposite ends of a length of the filamentary material to form the loop, and the knot is disposed within the slot, preferably within an enlarged region of the slot More preferably, the rotary transmission element is disposed adjacent said first end of the support and between the first pulleys but is displaced below the axis of movement of the slider, and the filamentary material passes over one of the first pulleys, several times (preferably at least 2.5 times to ensure no slippage) around the rotary transmission element and then back over the other of the first pulleys.

The terms "upper", "lower" and "below" as used herein refer to the positions of the respective parts when the signal controller is mounted in a horizontal or slightly inclined control panel.

Preferably, the first pulleys have their axes of rotation mutually inclined such that the axis of rotation of each first pulley is approximately perpendicular to the direction of extent of a region of the filamentary material which extends between that first pulley and the rotary transmission element. This reduces wear of the filamentary material during passage over the first pulleys.

Preferably, the first pulleys are mounted so that they are mutually displaced in the longitudinal direction of the elongate support by a distance which corresponds approximately to the separation, along the longitudinal axis of the rotary transmission element, between those regions of the filamentary material which extend from the transmission element to the respective first pulleys.

Most conveniently, the rotatable encoder member has its axis of rotation coincident with that of the rotary transmission element.

The signal controller preferably further includes a motor which is drivingly connected with the rotary transmission element and the rotatable encoder member. The position of the slider can be altered between studio sessions and it is often important to reproduce exactly the same settings over a bank of faders from one session to the next. In order to achieve this, the positions of the sliders are stored electronically at the end of a session, and the motors are generally used to drive the sliders to the desired position at the start of a session.

In order to provide a particularly compact low profile arrangement, it is preferred for the motor to be displaced below the axis of movement of the slider and mounted with its longitudinal direction of extent in substantial alignment with that of the elongate support.

Most conveniently, there is a direct drive between the motor and the rotary transmission element and the rotatable encoder member. The rotary transmission element may be fitted on the side of the rotatable encoder member remote from the motor, but is preferably mounted between the motor and the rotatable encoder member.

The digital encoder may be an optical encoder wherein the rotatable encoder member is a toothed or apertured disk, or it may be a magnetic encoder including a magneto-resistive or a Hall-effect device wherein the rotatable encoder member has magnetic regions thereon. The encoder may be quadrature sensitive in order to distinguish the direction of movement of the position indicator.

Preferably, the rotary transmission element has a cylindrical surface with a helical groove therein, and the loop of filamentary material is wound around the cylindrical surface so as to engage in the helical groove.

The filamentary material may be a cord, wire, string, cable or other filamentary material of approximately circular cross-section. This facilitates implementation of the arrangement with the encoder in substantial alignment with that of the elongate support. This is because, in such an arrangement, there are three-dimensional changes in the path of movement of the filamentary material, as compared to the use of a toothed drive band. Also, the use of a toothed drive band can result in a rough feel to the slider because of the engagement of the teeth in the belt with a toothed transmission element driven by the belt. The use of a filamentary material which is wound in a helical groove in the rotary transmission element gives a smoother feel to the slider. The helical groove serves to control the position of the turns of the filamentary material on the rotary transmission element so that there is little likelihood of the turns overlapping one another during rotation of the element Preferably the slider is touch sensitive to facilitate discrimination between manual operation and motor operation of the slider.

BRIEF DESCRIPTION OF THE DRAWINGS

The invention will now be described, by way of example, with reference to the accompanying drawings in which:

FIG. 1 is a perspective view of a signal controller according to the present invention in the form of a linear motion digital fader shown without a cover thereon;

FIG. 2 is a view of a first end of the fader of FIG. 1;

FIG. 3 is a plan view of part of the fader of FIGS. 1 and 2 showing the arrangement of pulleys at the first end of the fader:

FIG. 4 is a perspective view of a cover for the fader of FIGS. 1 to 3;

FIG. 5 is a perspective view of parts of the fader of FIGS. 1 to 4;

FIG. 6 is a perspective view showing a slider of the fader in greater detail;

FIG. 7 is a perspective view showing the mounting of a motor of the fader in greater detail;

FIG. 8 is an exploded perspective view showing a slider mounting tube of the fader in greater detail.

DETAILED DESCRIPTION OF THE PREFERRED EMBODIMENT

Figure 9:
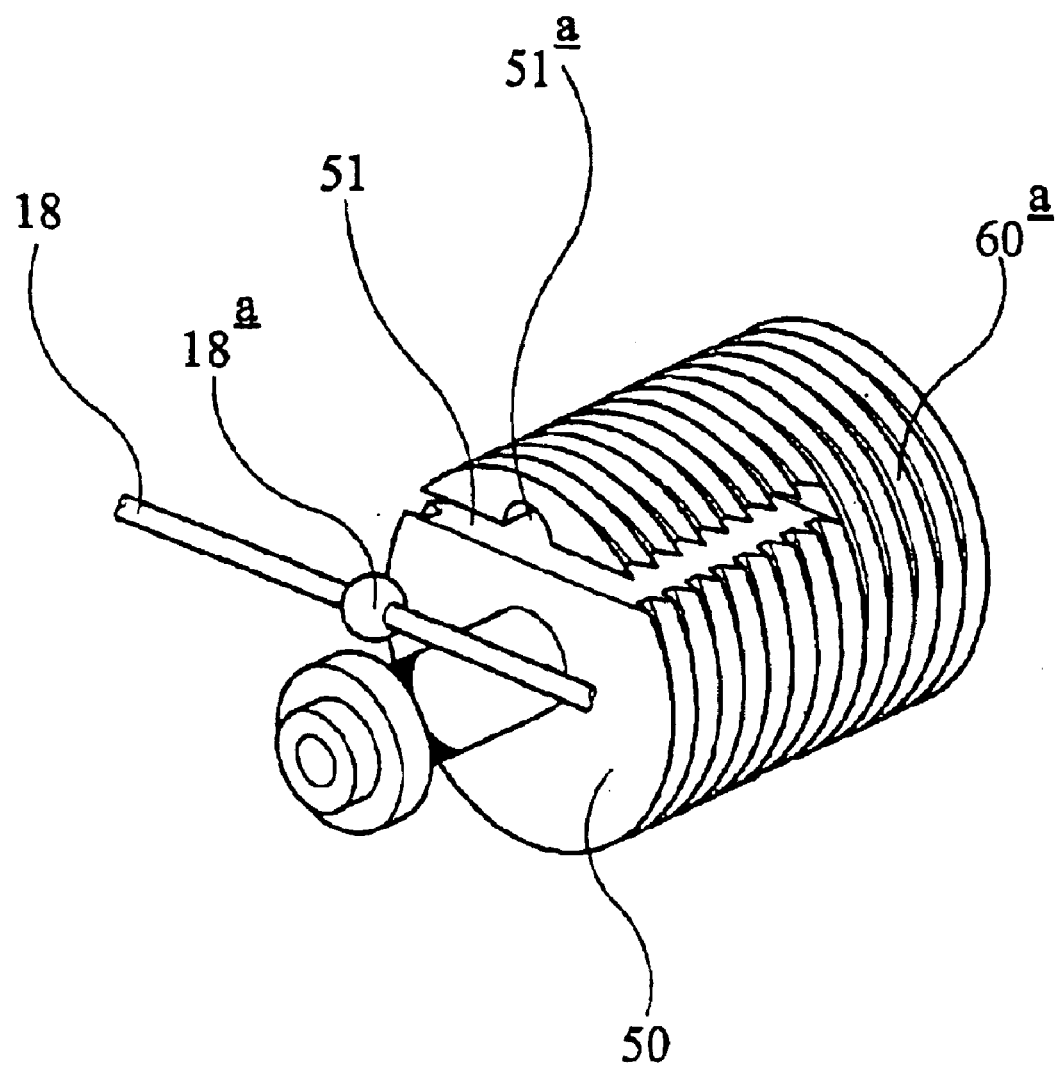
FIG. 9 is a detail view showing a preferred embodiment.

The linear motion digital fader as illustrated in the drawings basically comprises an elongate support 10, a manually settable slider 12, a digital encoder 14, a drive transmission 16 including a continuous loop of cord 18, and an electric motor 20.

The elongate support 10 is moulded from a plastics material such as an acetal resin and includes a base 10a, a side wall 10b extending upwardly from one longitudinal side of the base 10a, an end wall 10c at a first end of the body 10, and an apertured flange 10d. The end wall 10c has an aperture therein which is substantially aligned with that in the flange 10d. Both the end wall 10c and the apertured flange 10d extend away from, the base 10a on the opposite surface thereof to the side wall 10b. The elongate support 10 is formed with first and second mouldings 10e and 10f at its first end and its opposite, second end, respectively. The mouldings 10e and 10f have holes 22 and 24 therein which, in use, receive fixing screws (not shown) for attaching the fader together with an attached casing 26 (see FIG. 4) under the panel of a control desk (not shown). The first moulding 10e has a pair of further holes 28 therein (see particularly FIGS. 1, 3 and 8). The first moulding 10e is formed with a mounting boss 32 (FIG. 8) which faces in the direction of the second end of the support 10.

At the second end of the elongate support 10, there are a pair of bushes 30 which are integrally moulded with the support 10 (see particularly FIG. 8). The second moulding 10f includes a C-shaped recess 34 which is directed towards the first end of the support 10 and which opens upwardly. The mounting boss 32 and the recess 34 are mutually aligned and receive opposite ends of a tube 36. The boss 32 fits into one end of the tube 36 whilst the opposite end of the tube is snap-fitted into the recess 34 via its upper opening. In this way, the tube 36 is firmly held in position so that it extends longitudinally of the elongate support 10 parallel to the side wall 10b.

The slider 12 (see particularly FIG. 6) comprises a pair of bushes 38 through which the tube 36 passes. Thus, the tube 36 is passed through the bushes 38 before being secured in the elongate support 10. The bushes 38 are disposed to one side of an upstanding T-shaped flange 40 of the slider 12. On the opposite side of the T-shaped flange 40, the slider 12 is provided with an integrally moulded shaped tang 42 which is shaped so that a first portion 42a thereof engages against the upper edge of the side wall 10b, whilst a second portion 42b thereof engages in a groove 44 in the inner surface of the side wall 10b. The groove 44 extends longitudinally of the elongate support 10. It will therefore be understood that the provision of the bushes 38 which slide on the tube 36 and the tang 42 which engages against the top of the side wall 10b and in the groove 44 therein provides a good bearing surface for sliding movement of the slider 12 and also minimises wobble of the slider 12 in use.

The digital encoder 14 includes a rotatable encoder disk 46 with a multiplicity of radial slits therethrough around its circumference. The disk 46 is secured to the end of a rotary shaft 48. The disk 46 extends into a slot 50 in a housing 52 in which a LED and one or more photodiodes or phototransistors (not shown) are mounted in alignment with the path of movement of the slits in the disk 46. The LED is disposed on opposite side of the disk 46 to the photodiode(s)/ phototransistor(s). The housing 52 is mounted on a rectangular printed circuit board 54 which is disposed below the axis of sliding movement of the slider 12. The printed circuit board 54 is secured to the bottom edges of the end wall 10c and the apertured flange 10d by means of deformable mounting posts 58 (see FIG. 7). The printed circuit board 54 also carries an electrical connector 58 to enable the required electrical connections to be made to the fader.

The motor 20 has axial mounting bosses 56 (only one shown—see FIG. 7) at opposite ends thereof. One of the mounting bosses 56 (illustrated in FIG. 7) is engaged in the aperture in the end wall 10c whilst the other mounting boss is engaged in the aperture in the flange 10d. The flange 10d is sufficiently flexible that the motor 20 can be engaged first with the end wall 10c and then snap-fitted into engagement with the apertured flange 10d. In this way, the motor 20 is firmly held in position under the base 10a.

The shaft 48 is in alignment with, and secured to a rotor shaft (not shown), of the motor 20. Thus, the shaft 48 is drivable directly by the motor 20 about an axis which extends longitudinally relative to the elongate support 10 and below the slider 12.

The drive transmission 16 includes a cylindrical transmission pulley 60 which is mounted on the shaft 48 between the disk 4& and the motor 20. The pulley 60 has a cylindrical peripheral surface in which a scroll or helical groove 60a (FIG. 9) is provided. The pitch of the helical groove 60a is slightly larger than the diameter of the cord 18. Parts of the cord 18 are wound several times (in this embodiment about 5 times) around the pulley 50 so as to lie in the groove. In a preferred embodiment (see FIG. 9), the ends of the cord 18 are joined together by a knot 18a to form the continuous loop are engaged, along with the knot 18a, in a transverse chordal slot 51 formed in the end of the pulley 50. The knot 18a is engaged in an enlarged region 51a centrally of the slot 51. The slot 51 opens at each end onto the peripheral surface of the pulley 50 to allow the cord 18 to be engaged in the helical groove. The portions of the cord 18 on either side of the slot 51 are wound around the groove 60a 2.5 times in order to obtain the number of revolutions of the pulley 60 that equates to the linear stroke of the fader. The location of the cord 18 and knot 18a in the slot 51 serves to retain the cord 18 securely in place without risk of slipping relative to the pulley 50 in use, and avoids an arrangement where the knot 18a has to pass over any of the pulleys.

As can be seen from FIG. 1, the transmission pulley 60 is disposed adjacent to the outer surface of the end wall 10c and below the moulding 10e at the first end of the elongate support 10

Portions of the cord 18 extend upwardly from opposite sides of the transmission pulley 60 and each passes around a respective one of pair of first pulleys 62 and 64. From the first pulley 62; the cord 18 runs along the elongate support 10 to the opposite, second end where it passes around a pair of second pulleys 66 and 68. From the pulley 68, the cord 18 passes back to the first pulley 64. However, between the second pulley 68 and the first pulley 64, the cord 18 is clamped to the tang 42 of the slider 12.

The second pulleys 66 and 68 are rotatable about vertical axes and are mounted on the bushes 30 at the second end of the elongate support 10. The first pulleys 62 and 64 are mounted in the holes 28 in the first moulding 10e so that each of their axes of rotation is approximately perpendicular to the direction of extent of the portion of the cord 18 which runs between the transmission pulley 60 and the respective first pulley 62 and 64. This can be seen in FIG. 2. Such arrangement reduces wear on the cord 18 against the sides flanges of the first pulleys 62 and 64. Additionally, and as can be seen in FIG. 3, the first pulleys 62 and 64 are mounted in the first moulding 10e so that they are mutually displaced in the longitudinal direction of the elongate support 10. The mutual displacement corresponds approximately to the separation, along the longitudinal axis of the transmission pulley 60, between those portions of the cord 18 which extend from the transmission pulley 60 to the respective first pulleys 62 and 64. This axial displacement is as a result of the wrapping of the cord 18 a number of times around the transmission pulley 60. The arrangement is such that, when the slider 12 is approximately in the mid-position of its sliding movement, the cord 18 engages each first pulley 62 and 64 over an angle of 90 degrees.

Referring now to FIG. 4, the casing 26 has a slot 70 therein through which the T-shaped flange 40 of the slider 12 passes with clearance. The casing 26 is held in position by deformable fixing tabs 76 and guide tabs 78 which engage variously with the elongate support 10 and the printed circuit board 54. The casing 26 also has integral support legs that enable the fader to be soldered into a printed circuit board directly below the fader.

The T-shaped flange 40 of the slider 12 is fitted with a touch-sensitive, conductive knob (not shown) which is connected by a flexible cable (also not shown) to the printed circuit board 54.

The motor 20 is used to drive the slider 12, via the transmission pulley 60 and the cord 18, to its desired position, from a known reference position, during an initial set-up operation. The rotation of the transmission pulley 60 is also transmitted to the encoder disk 46.

Upon touching the control knob on the slider 12, an operator automatically disengages the motor 20, in a manner known per se so that the slider 12 becomes manually operable. The manual operation of the slider 12 is translated by the cord 18 into rotation of the encoder disk 46.

As the slits of the encoder disk 46 pass in front of the LED, the light passing through the slits is sensed in a quadrature sensitive manner by the photodiode(s)/ phototransistor)(s) of the digital encoder 14. The quadrature sensitive manner of the light detection allows the direction of motion of the slider 12 to be determined. The digital output from the digital encoder 14 can be either sine-wave quadrature form or Schmidt triggered. The sine-wave quadrature output gives a high-resolution output signal, whereas the Schmidt triggered output allows the use of low cost digital interfacing circuitry.

The position of the slider 12 relative to a reference position can be calculated from the number of pulses output from the photodiode(s)/phototransistor(s) and subsequent processing converts this into the signal associated with the given channel.

The arrangement of the components within the fader is a very compact and efficient arrangement, thereby increasing the response speed of operation of the slider 12 when driven by the motor 20. Also, the resolution of motion sensing is enhanced as a result of the relatively large diameter ratio of the encoder disk 46 to the transmission pulley 60.

What is claimed is:

1. A signal controller comprising:
   an elongate support;
   a manually settable slider mounted for linear reciprocatory sliding movement between limit positions relative to the elongate support;

a digital encoder having a rotary encoder member; and a drive transmission including a loop of filamentary material operably interconnecting the slider and the rotary encoder member such that, in use, movement of the slider produces a digital output signal from the digital encoder, wherein the digital encoder has a longitudinal direction of extent which is in substantial alignment with that of the elongate support.

2. A signal controller as claimed in claim 1, wherein the filamentary material is selected from one of a cord, wire, string, cable or other filamentary material of approximately circular cross-section.

3. A signal controller as claimed in claim 1, wherein the rotatable encoder member has its axis of rotation coincident with that of the rotary transmission element.

4. A signal controller as claimed in claim 1, further including a motor which is drivingly connected with the rotatable encoder member.

5. A signal controller as claimed in claim 4, wherein there is a direct drive between the motor and the rotatable encoder member.

6. A signal controller as claimed in claim 4, wherein the motor is displaced below the axis of movement of the slider and mounted with its longitudinal direction of extent in substantial alignment with that of the elongate support.

7. A signal controller as claimed in claim 6, wherein the rotary transmission element has a cylindrical surface with a helical groove therein and the loop of filamentary material is wound around the cylindrical surface co as to engage in the helical groove.

8. A signal controller as claimed in claim 7, wherein the rotary transmission element has a cylindrical surface with a helical groove therein and the loop of filamentary material is wound around the cylindrical surface so as to engage in the helical groove.

9. A signal controller as claimed in claim 1, wherein the drive transmission includes a rotary transmission element which is operably connected to the rotary encoder member.

10. A signal controller as claimed in claim 9, wherein the rotary transmission element has an axis of rotation which extends in the longitudinal direction of extent of the elongate support.

11. A signal controller as claimed in claim 9, wherein the rotary transmission element has a slot therein in which the filamentary material is received.

12. A signal controller as claimed in claim 11, wherein the filamentary material has a knot which is engaged in the slot.

13. A signal controller as claimed in claim 11, wherein the first pulleys have their axes of rotation mutually inclined such that the axis of rotation of each first pulley is approximately perpendicular to the direction of extent of a region of the filamentary material which extends between that first pulley and the rotary transmission element.

14. A signal controller as claimed in claim 11, wherein the rotary transmission element is disposed adjacent said first end of the support and between the first pulleys but is displaced below the axis of movement of the slider, and the filamentary material passes over one of the first pulleys, several times around the rotary transmission element and then back over the other of the first pulleys.

15. A signal controller as claimed in of claim 11, wherein the first pulleys are mounted so that they are mutually displaced in the longitudinal direction of the elongate support by a distance which corresponds approximately to the separation, along the longitudinal axis of the rotary transmission element, between those regions of the filamentary material which extend from the transmission element to the respective first pulleys.

16. A signal controller as claimed in claim 1, wherein the drive transmission includes a pair of first pulleys at or adjacent a first end of the elongate support and a pair of second pulleys at or adjacent a second, opposite, end of the elongate support, the pulleys of each pair being mutually spaced apart laterally relative to the longitudinal direction of extent of the elongate support, wherein the filamentary material passes around the first and second pulleys.

17. A signal controller as claimed in claim 16, wherein the drive transmission includes a rotary transmission element which is operably connected to the rotary encoder member.

18. A signal controller as claimed in claim 17, wherein the rotary transmission element has an axis of rotation which extends in the longitudinal direction of extent of the elongate support.

19. A signal controller as claimed in claim 18, wherein the rotary transmission element has a slot therein in which the filamentary material is received.

20. A signal controller as claimed in claim 19, wherein the filamentary material has a knot which is engaged in the slot.

21. A signal controller comprising:

an elongate support;

a manually settable slider mounted for linear reciprocatory sliding movement between limit positions relative to the elongate support;

a digital encoder having a rotary encoder member; and a drive transmission including a loop of filamentary material operably connected to the slider and a rotary transmission element for providing rotational movement to the rotary encoder member, the rotary transmission element having a cylindrical surface with a helical groove therein, wherein the loop of filamentary material is wound around the cylindrical surface so as to engage in the helical groove such that, in use, movement of the slider causes rotation of the rotary transmission element and produces a digital output signal from the digital encoder.

22. A signal controller as claimed in claim 21 wherein the digital encoder has a longitudinal direction of extent which is in substantial alignment with that of the elongate support.

23. A signal controller as claimed in claim 21, wherein the loop of filamentary material is wound several times around the cylindrical surface.

24. A signal controller as claimed in claim 21, wherein the rotary transmission element has an axis of rotation which extends in the longitudinal direction of extent of the elongate support.

25. A signal controller as claimed in claim 21, wherein the rotary transmission element has a slot therein in which the filamentary material is received.

26. A signal controller as claimed in claim 25, wherein the filamentary material has a knot which is engaged in the slot.

27. A signal controller comprising:

an elongate support;

a manually settable slider mounted for linear reciprocatory sliding movement between limit positions relative to the elongate support;

a digital encoder having a rotary encoder member; and a drive transmission including:

a rotary transmission element which is operably connected to the rotary encoder member;

first pulley means comprising a pair of first pulleys at or adjacent a first end of the elongate support;

second pulley means at or adjacent a second, opposite, end of the elongate support; and a loop of filamentary material operably connected to the slider and passing around one of the first pulleys, around the rotary transmission element, around the other of the first pulleys and around the second pulley means, whereby movement of the slider is operable for driving the drive transmission so as to rotate the rotary encoder member and produce a digital output signal from the digital encoder.

28. A signal controller as claimed in claim 27, wherein the digital encoder has a longitudinal direction of extent which is in substantial alignment with that of the elongate support.

29. A signal controller as claimed in claim 27, wherein the rotary transmission element has an axis of rotation which extends in the longitudinal direction of extent of the elongate support.

* * * * *